US010755892B2

(12) United States Patent
Huang (10) Patent No.: US 10,755,892 B2
(45) Date of Patent: Aug. 25, 2020

(54) REFLECTION-MODE ELECTRON-BEAM INSPECTION USING PTYCHOGRAPHIC IMAGING (71) Applicant: KLA-Tencor Corporation, Milpitas, CA (US)

(72) Inventor: Weijie Huang, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/412,505

(22) Filed: May 15, 2019

(65) Prior Publication Data
US 2019/0362935 A1    Nov. 28, 2019

Related U.S. Application Data (60) Provisional application No. 62/675,645, filed on May 23, 2018.

(51) Int. Cl.
*H01J 37/29* (2006.01)
*G06T 11/00* (2006.01)
(Continued)

(52) U.S. Cl.
CPC ............ *H01J 37/29* (2013.01); *G06T 3/4053* (2013.01); *G06T 11/006* (2013.01);
(Continued)

(58) Field of Classification Search
CPC ...... H01J 37/29; H01J 37/1475; H01J 37/261; H01J 2237/226; G06T 3/4053; G06T 11/006; G06T 2221/424
See application file for complete search history.

(56) References Cited

U.S. PATENT DOCUMENTS 7,348,566 B2    3/2008   Tromp
10,162,161 B2   12/2018  Horstmeyer et al.
(Continued)

OTHER PUBLICATIONS

International Search Report and Written Opinion dated Aug. 29, 2019 for PCT/US2019/033196.
(Continued)

*Primary Examiner* — David E Smith
(74) *Attorney, Agent, or Firm* — Suiter Swantz pc llo (57) ABSTRACT A particle-beam inspection system may include a reflective particle-beam imaging system providing an image of a selected portion of a sample and a diffraction pattern of the selected portion of the sample and a controller communicatively coupled to the reflective particle-beam imaging system. The controller may receive two or more sample-plane images from the reflective particle-beam imaging system associated with two or more selected portions of the sample, where at least some of the two or more selected portions of the sample overlap. The controller may further receive two or more diffraction-plane images from the reflective particle-beam imaging system associated with the two or more selected portions of the sample. The controller may further construct one or more output images of the two or more selected portions of the sample from the two or more diffraction-plane images using phase information obtained from the two or more sample-plane images.

32 Claims, 6 Drawing Sheets (51) Int. Cl.
  *H01J 37/26* (2006.01)
  *H01J 37/147* (2006.01)
  *G06T 3/40* (2006.01)

(52) U.S. Cl.
  CPC ........ *H01J 37/1475* (2013.01); *H01J 37/261* (2013.01); *G06T 2211/424* (2013.01); *H01J 2237/226* (2013.01)

(56) References Cited

U.S. PATENT DOCUMENTS

| | | |
|---|---|---|
| 2014/0007307 A1 | 1/2014 | Routh, Jr. et al. |
| 2015/0300964 A1* | 10/2015 | Humphry ............... G01N 23/20 250/395 |
| 2015/0331228 A1 | 11/2015 | Horstmeyer et al. |
| 2016/0266366 A1 | 9/2016 | Chung et al. |
| 2017/0024908 A1* | 1/2017 | Bosch .................. G06T 11/003 |
| 2017/0031246 A1* | 2/2017 | Den Boef .......... G01N 21/4788 |
| 2018/0048811 A1* | 2/2018 | Waller .................. G02B 21/06 |

OTHER PUBLICATIONS

Humphry, M. J. et al., "Ptychographic Electron Microscopy Using Angle Dark-Field Scattering for Sub-nanometer Resolution Imaging", Nature Communications 3, 730, pp. 1-7 (2012).

Rodenburg, J.M., "Ptychography and Related Diffractive Imaging Methods", Advances in Imaging and Electron Physics 150, pp. 87-184 (2008).

* cited by examiner

REFLECTION-MODE ELECTRON-BEAM INSPECTION USING PTYCHOGRAPHIC IMAGING

CROSS-REFERENCE TO RELATED APPLICATION

The present application claims the benefit under 35 U.S.C. § 119(e) of U.S. Provisional Application Ser. No. 62/675,645, filed May 23, 2018, entitled HIGH SPEED ELECTRON INSPECTION APPARATUS USING PTYCHOGRAPHIC IMAGING, naming Weijie (Jason) Huang as inventor, which is incorporated herein by reference in the entirety.

TECHNICAL FIELD

The present disclosure relates generally to semiconductor inspection and, more particularly, to semiconductor inspection with electron beams.

BACKGROUND

Inspection metrology is typically utilized to evaluate and/or control various process steps throughout a semiconductor fabrication process. It is typically desirable to provide high-resolution inspection with a high throughput to provide sufficient data for evaluation and/or control within acceptable throughput requirements. Various inspection technologies provide different tradeoffs between resolution and throughput and may thus be strategically utilized within an inspection process. However, advances in fabrication technology providing smaller and more complex devices require commensurate advances in inspection technology to maintain a desired throughput. Accordingly, it is desirable to provide systems and methods for accurate and efficient inspection.

SUMMARY

A particle-beam inspection system is disclosed in accordance with one or more illustrative embodiments of the present disclosure. In one illustrative embodiment, the system includes a reflective particle-beam imaging system providing an image of a selected portion of a sample and a diffraction pattern of the selected portion of the sample. In another illustrative embodiment, the system includes a controller communicatively coupled to the reflective particle-beam imaging system. In another illustrative embodiment, the controller receives two or more sample-plane images from the reflective particle-beam imaging system associated with two or more selected portions of the sample, where at least some of the two or more selected portions of the sample overlap. In another illustrative embodiment, the controller receives two or more diffraction-plane images from the reflective particle-beam imaging system associated with the two or more selected portions of the sample. In another illustrative embodiment, the controller constructs one or more output images of the two or more selected portions of the sample from the two or more diffraction-plane images using phase information obtained from the two or more sample-plane images.

A particle-beam inspection system is disclosed in accordance with one or more illustrative embodiments of the present disclosure. In one illustrative embodiment, the system includes a controller communicatively coupled to a reflective particle-beam imaging system providing an image of a selected portion of a sample and a diffraction pattern of the selected portion of the sample. In another illustrative embodiment, the controller receives two or more sample-plane images from the reflective particle-beam imaging system associated with two or more selected portions of the sample, where at least some of the two or more selected portions of the sample overlap. In another illustrative embodiment, the controller receives two or more diffraction-plane images from the reflective particle-beam imaging system associated with the two or more selected portions of the sample. In another illustrative embodiment, the controller constructs one or more output images of the two or more selected portions of the sample from the two or more diffraction-plane images using phase information obtained from the two or more sample-plane images.

An inspection method is disclosed in accordance with one or more illustrative embodiments of the present disclosure. In one illustrative embodiment, the method includes receiving two or more sample-plane images from the reflective particle-beam imaging system associated with two or more selected portions of the sample, where at least some of the two or more selected portions of the sample overlap. In another illustrative embodiment, the method includes receiving two or more diffraction-plane images from the reflective particle-beam imaging system associated with the two or more selected portions of the sample. In another illustrative embodiment, the method includes constructing one or more output images of the two or more selected portions of the sample from the two or more diffraction-plane images using phase information obtained from the two or more sample-plane images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for ptychographic imaging using particle beams for efficient high-resolution inspection in a reflection-mode configuration suitable for inspection of semiconductor devices. In some embodiments, reflective ptychographic imaging generates high-resolution output images of the sample by transforming diffraction-plane images including diffraction patterns of the sample using phase information from sample-plane images based on ptychographic techniques. In this regard, the combination of diffraction imaging and ptychographic imaging may provide output images with higher resolution than directly-generated sample-plane images.

Imaging-based inspection systems typically characterize a sample by generating an image of the sample and comparing the image to a reference, which may include an image of a reference sample, a simulated image, design data, or the like. A sample image may be generated through various techniques. For example, a scanning imaging system may generate an image by scanning a tightly focused inspection beam (e.g., a particle beam, an optical beam, or the like) on the sample and sampling captured radiation emanating from the sample (e.g., electrons, photons, or the like) with a single-pixel detector to build up the image pixel by pixel. By way of another example, a projection imaging system may illuminate a relatively larger area on the sample (e.g., a field of view) and generate an image of the entire field of view on a multipixel detector.

It is recognized herein that projection imaging typically provides relatively higher throughput than scanning imaging due to the relatively larger sample area characterized at a given time, but may provide lower resolution. The resolution of a scanning imaging system is typically limited by the focused spot size of the illumination beam. Accordingly, high-resolution scanning systems typically use particle beams (e.g., electron-beams, ion beams, neutral particle beams, or the like) suitable for tight focusing. In contrast, aberrations in imaging elements (e.g., spherical aberration, chromatic aberration, and the like) typically limit the resolution and/or the field of view of projection imaging systems.

It is further recognized that inspection of semiconductor devices typically requires a reflection-mode system due to the materials and patterns present on the samples. However, reflective particle-beam projection-imaging inspection techniques such as, but not limited to, low-energy electron microscopy (LEEM) are particularly sensitive to aberrations induced by the reflection imaging optics. As an illustrative example, uncorrected LEEM microscopy may typically be limited to resolutions on the order of tens of nanometers, whereas transmission-mode electron imaging may provide sub-nanometer resolution. Further, aberration correction technology for reflective projection-mode particle imaging may provide some increase in resolution, but may introduce undesirable system cost and/or complexity. Aberration correction cathode lens microscopy is generally described in U.S. Pat. No. 7,348,566, which is incorporated herein by reference in its entirety.

In some embodiments of the present disclosure, reflective particle-beam projection-imaging inspection utilizes diffraction imaging based on images of a sample at both a sample plane and a diffraction plane to generate a high-resolution image of the sample, even in the presence of aberrations induced by imaging optics. A sample plane (e.g., an image plane, or the like) is conjugate to the sample and is indicative of the spatial layout of features on the sample. In contrast, a diffraction plane (e.g., a plane conjugate to a back focal plane of an objective lens) is indicative of angles at which radiation is emitted from the sample. Accordingly, distributions in a sample plane and a diffraction plane may be related by a Fourier Transform relationship. For example, a diffraction-plane image may be converted to a sample-plane image through an inverse Fourier Transform operation.

Further, a diffraction plane image may contain amplitude information with a high-spatial resolution (e.g., sub-nanometer resolution) even in the presence of aberrations induced by imaging optics, but may lack sufficient phase information to directly provide a correspondingly high-resolution sample-plane image through an inverse Fourier Transform operation. In some embodiments, an output image of the sample is constructed by performing an inverse Fourier Transform operation on a diffraction-plane image supplemented with phase information from a sample-plane image. In this regard, the resulting output image may have a higher resolution than the sample-plane image in the presence of aberrations. Diffraction imaging is generally described in U.S. Patent Publication No. 2017/0031246, which is incorporated herein by reference in its entirety.

In some embodiments of the present disclosure, reflective particle-beam projection-imaging inspection utilizes ptychographic diffraction imaging. It is recognized herein that supplementing a diffraction-plane image with phase information from a sample-plane image requires objects of interest to have a finite boundary (e.g., an area or volume in real space where only the object of interest exists). However, most samples extend in two or three dimensions beyond the imaged area such that the finite boundary requirement is not satisfied. In some embodiments, the finite boundary constraint is overcome by sampling overlapping regions on the sample. For example, sample-plane and diffraction plane images may be generated at multiple overlapping positions. In this regard, overlapping diffraction-plane images may be supplanted with phase information from overlapping sample-plane images using a ptychographic imaging technique to generate a high-resolution output image of an extended sample in a reflection-mode configuration.

It is noted that, for the purposes of clarity, the present disclosure focuses on electron-beam (e-beam) inspection. However, descriptions and examples incorporating electron beams should not be interpreted as limiting and may be applied to any type of particle beams such as, but not limited to, ion beams or beams of neutral particles.

Figure 1A:
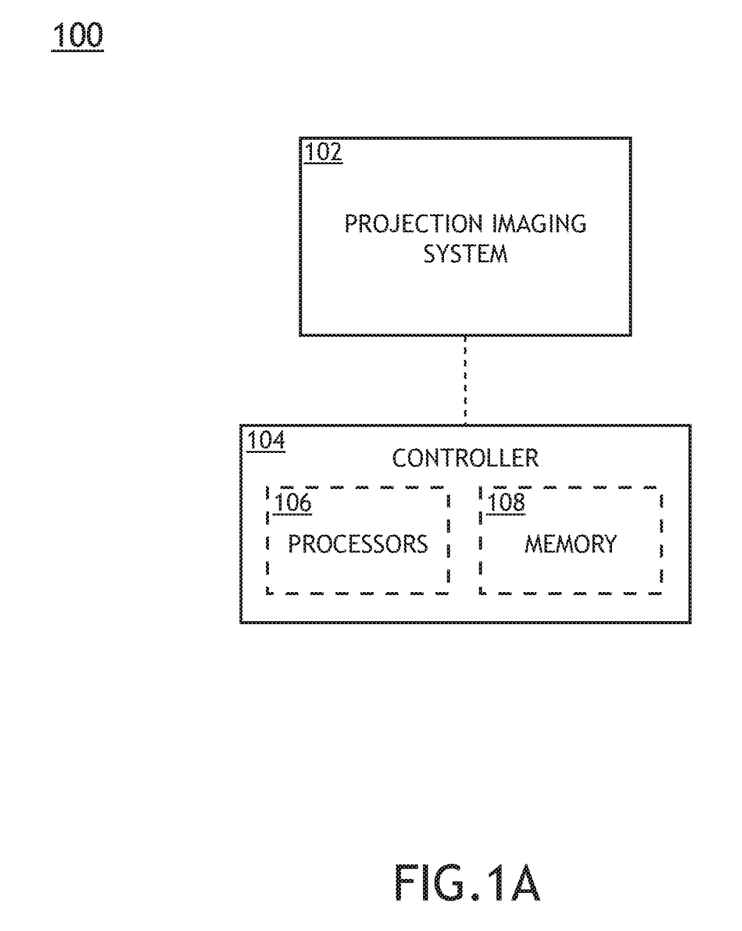
FIG. 1A is a block diagram of a ptychographic inspection system suitable for reflection-mode imaging using particle beams, in accordance with one or more embodiments of the present disclosure.

FIG. 1A is a block diagram of a ptychographic inspection system 100 suitable for reflection-mode imaging using particle beams, in accordance with one or more embodiments of the present disclosure.

In another embodiment, the ptychographic inspection system 100 includes a projection imaging sub-system 102 to generate images of a sample in a reflection mode using particle-beam illumination. The projection imaging sub-system 102 may include any number or type of particle beams to generate an image including, but not limited to, one or more electron beams, one or more ion beams, or one or more neutral particle beams. Further, the projection imaging sub-system 102 may include any type of reflective projection-mode imaging system known in the art such as, but not limited to, a LEEM system.

In another embodiment, the projection imaging sub-system 102 is configured to generate at least a sample-plane image and a diffraction-plane image at any selected region or regions on the sample. In another embodiment, though not shown, the ptychographic inspection system 100 includes an optical imaging sub-system (e.g., an optical microscope) for the generation of one or more sample-plane images. Further, the optical imaging sub-system may be integrated with or be distinct from a particle-based imaging sub-system (e.g., the projection imaging sub-system 102).

In another embodiment, the ptychographic inspection system 100 includes a controller 104 communicatively coupled to the projection imaging sub-system 102. In another embodiment, the controller 104 includes one or more processors 106 configured to execute program instructions maintained on a memory medium 108. In this regard, the one or more processors 106 of controller 104 may execute any of the various process steps described throughout the present disclosure. For example, the one or more processors 106 may receive sample-plane and diffraction-plane images from the projection imaging sub-system 102. By way of another example, the processors 106 may perform one or more processing steps to the sample-plane and diffraction-plane images. In some embodiments, the processors 106 construct an output image of a sample using the sample-plane and diffraction-plane images from the projection imaging sub-system 102 using any combination of diffraction imaging or ptychographic techniques.

The one or more processors 106 of a controller 104 may include any processing element known in the art. In this sense, the one or more processors 106 may include any microprocessor-type device configured to execute algorithms and/or instructions. In one embodiment, the one or more processors 106 may include a desktop computer, mainframe computer system, workstation, image computer, parallel processor, or any other computer system (e.g., networked computer) configured to execute a program configured to operate the ptychographic inspection system 100, as described throughout the present disclosure. It is further recognized that the term "processor" may be broadly defined to encompass any device having one or more processing elements, which executes program instructions from a non-transitory memory medium 108. Further, the steps described throughout the present disclosure may be carried out by a single controller 104 or, alternatively, multiple controllers. Additionally, the controller 104 may include one or more controllers housed in a common housing or within multiple housings. In this way, any controller or combination of controllers may be separately packaged as a module suitable for integration into ptychographic inspection system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory, a random access memory, a magnetic or optical memory device (e.g., disk), a magnetic tape, a solid state drive, and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet, and the like). Therefore, the above description should not be interpreted as a limitation on the present invention but merely an illustration.

Figure 1B:
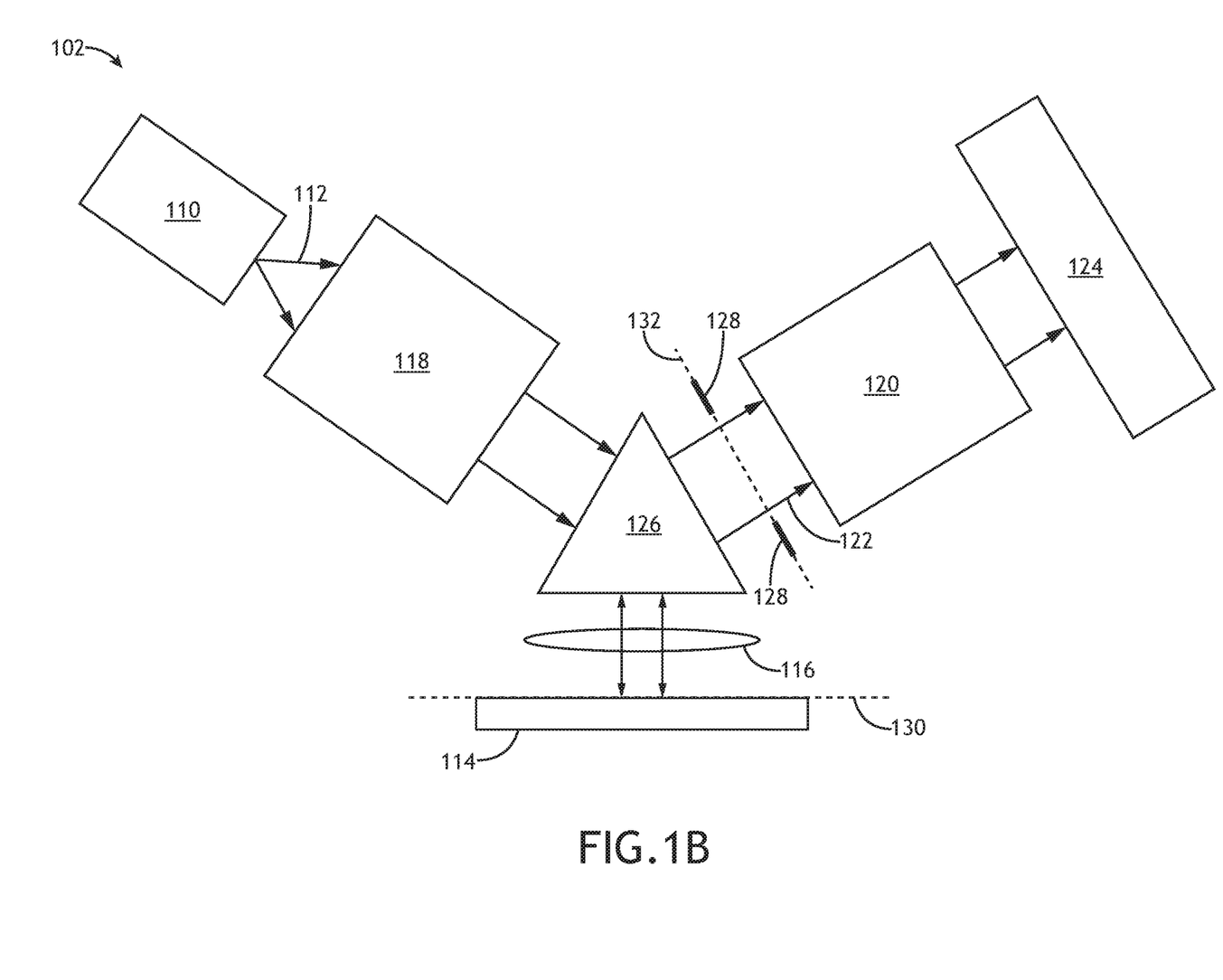
FIG. 1B is a conceptual view of a projection imaging sub-system, in accordance with one or more embodiments of the present disclosure.

FIG. 1B is a conceptual view of a projection imaging sub-system 102, in accordance with one or more embodiments of the present disclosure.

In one embodiment, the projection imaging sub-system 102 includes a particle source 110 (e.g., an electron beam source, an ion beam source, or the like) to generate a particle illumination beam 112 (e.g., an electron beam, a particle beam, or the like). The particle source 110 may include any particle source known in the art suitable for generating an illumination beam 112. For example, the particle source 110 may include any type of particle source known in the art including, but not limited to an electron source, an ion source, or a neutral particle source. In this regard, the illumination beam 112 may include an electron beam (e-beam), an ion beam, or a neutral particle beam.

Further, the particle source 110 may generate the illumination beam 112 using any technique known in the art. In one embodiment, the particle source 110 is a gun source (e.g., an electron gun, an ion gun, or the like). In this regard, the particle source 110 may operate as a point source and generate a divergent illumination beam 112. By way of another example, the particle source 110 may include a photocathode source (e.g., an electron photocathode). In this regard, the particle source 110 generates particles in response to incident illumination (e.g., a laser) on an electrode. For instance, an electron photocathode source may generate a beam of electrons based on illumination of an electrode with a laser source. It is recognized herein that photocathode sources may be suitable for generating highly parallel particle beams.

In another embodiment, the projection imaging sub-system 102 includes one or more optical elements configured to illuminate an extended area of a sample 114 (e.g., a target area) with the illumination beam 112 for imaging. It is to be understood that for the purposes of the present disclosure, the terms "optic," "optical element," "lens," and the like are used to describe elements suitable for any type of illumination beam 112 including, but not limited to, particle beams or light beams.

In one embodiment, the projection imaging sub-system 102 includes an objective lens 116 configured to be positioned near the sample 114. In another embodiment, the projection imaging sub-system 102 may include one or more illumination optics 118 configured to control, shape, and or modify the illumination beam 112 from the particle source 110. For instance, the illumination optics 118 may include any number of components to control, modify, shape, or filter the illumination beam 112 such as, but is not limited to, one or more lenses, one or more apertures, one or more stops, one or more pupils, one or more filters (e.g., one or more energy filters), or one or more beam correctors for shaping the illumination beam 112.

In another embodiment, the projection imaging sub-system 102 includes projection optics 120 to direct radiation from the sample 114 (e.g., sample radiation 122) to at least one detector 124. For example, the projection optics 120 may include any number of components to control, modify, shape, or filter the sample radiation 122 such as, but is not limited to, one or more lenses, one or more apertures, one or more stops, one or more pupils, or one or more filters.

Further, the optical elements within the projection imaging sub-system 102 (e.g., the objective lens 116, the illumination optics 118, the projection optics 120 or the like) may include any type of lenses known in the art suitable for particle beams including, but not limited to, electrostatic, magnetic, uni-potential, or double-potential lenses.

The detector 124 may include any type of detector known in the art. In one embodiment, the detector 124 includes one or more electron detectors (e.g., secondary electron detectors, backscattered electron detectors, or the like) suitable for detecting electrons emanating from the sample 114 in response to the incident illumination beam 112. In another embodiment, the detector 124 includes one or more photon detectors (e.g., a photodetector, an x-ray detector, a scintillating element coupled to photomultiplier tube (PMT) detector, or the like) for detecting photons emanating from the sample 114 in response to the incident illumination beam 112. Further, the detector 124 may include an array of detection elements (e.g., electron detectors, photon detectors, or the like) suitable for generating an image of a selected plane (e.g., a sample plane or a diffraction plane) associated with the target area of the sample 114.

It is recognized herein that a dynamic range of the detector 124 may critically impact the performance of the ptychographic inspection system 100. In particular, it may be desirable to provide a high-dynamic range for diffraction-plane images. For instance, low-frequency signals in a diffraction-plane image (e.g., associated with unscattered or reflected portions of the illumination beam 112) may be substantially stronger (sometimes several orders of magnitude larger) than high-frequency signals (e.g., associated with scattered or diffracted portions of the illumination beam 112, secondary emission, backscattered emission, or the like). In one embodiment, the detector 124 provides at least 16-20 effective bit resolution above the noise floor. It is to be understood, however, that the detector 124 may provide any selected dynamic range and/or bit resolution suitable to provide a selected level of performance.

In another embodiment, the objective lens 116 simultaneously directs the illumination beam 112 to the sample 114 and collects the sample radiation 122 from the sample 114. For example, the projection imaging sub-system 102 may include one or more elements to simultaneously direct the illumination beam 112 to the objective lens 116 and separate the sample radiation 122 from the illumination beam 112 such that the detector 124 may receive the sample radiation 122. For instance, the projection imaging sub-system 102 may include, but is not limited to, magnetic elements, electrostatic elements, or combinations thereof (e.g., a Wien filter, or the like). In one embodiment, as illustrated in FIG. 1B, the projection imaging sub-system 102 may include a magnetic prism 126 to simultaneously direct the illumination beam 112 to the objective lens 116 and separate the sample radiation 122 from the illumination beam 112.

The projection imaging sub-system 102 may generate sample-plane images and diffraction-plane images of the sample 114 using any technique known in the art. For example, the projection imaging sub-system 102 may provide, but is not limited to providing, bright-field or dark-field images. In one embodiment, the projection imaging sub-system 102 includes one or more apertures 128. For example, the projection imaging sub-system 102 may include an aperture 128 at a back focal plane of the objective lens 116 to limit the angles of the sample radiation 122 directed to the detector 124. Further, an aperture 128 may be used to select between bright-field and dark-field imaging.

In another embodiment, the particle source 110 is configured to provide a particle beam with a tunable energy. For example, a particle source 110 including an electron source may, but is not limited to, provide an accelerating voltage in the range of approximately 0.01 eV to approximately 50 kV. For example, a particle source 110 including an electron source may, but is not limited to, provide an accelerating voltage in the range of approximately 0.1 eV to approximately 30 kV. As another example, a particle source 110 including an ion source may, but is not required to, provide an ion beam with an energy in the range of approximately 1 to approximately 50 keV.

In another embodiment, the landing energy of particles on the sample 114 is adjustable. For example, the landing energy of particles on the sample 114 may be adjusted by controlling the potential difference between the particle source 110 and the sample 114, where decreasing the potential difference between the particle source 110 and the sample 114 decreases the landing energy. It is recognized herein that the penetration depth of the illumination beam 112 may depend on the landing energy of particles on the sample 114 such that higher-energy beams typically penetrate deeper into the sample 114. Further, the penetration depth as a function of particle energy may vary for different materials such that the selection of the particle energy for a particular layer may vary for different materials.

It is further recognized herein that the resolution of the ptychographic inspection system 100 providing multipixel imaging of the sample 114 is not limited by the real spot size of the illumination beam 112. A beam current of the illumination beam 112 may be generally increased to any selected level to provide a desired level of signal (e.g., sample radiation 122) without compromising the system resolution.

In one embodiment, the projection imaging sub-system 102 is configured as a low-energy electron imaging system. In this regard, sample-plane images may correspond to LEEM images and diffraction-plane images may correspond to low-energy electron diffraction (LEED) images. In this regard, low-landing-energy electrons may be limited to surface interactions and may thus be suitable for high-resolution imaging of complex surfaces. Further, it is recognized herein that low-landing-energy electrons may generate low-energy sample radiation 122, which is typically unable to penetrate through the sample radiation 122. Accordingly, the projection imaging sub-system 102 operating in reflection mode may capture sample radiation 122 including, but not limited to, secondary and/or diffracted electrons emanating from the sample surface.

The projection imaging sub-system 102 configured as a low-energy electron imaging system may provide electrons with any selected landing energy. In one embodiment, electrons from the illumination beam 112 have a landing energy of less than approximately 1 keV. In another embodiment, electrons from the illumination beam 112 have a landing energy of approximately 500 eV. In one embodiment, electrons from the illumination beam 112 have a landing energy of less than approximately 100 eV. It is to be understood, however, that the above examples are provided solely for illustration and should not be interpreted as limiting. The projection imaging sub-system 102 may provide an illumination beam 112 having any selected landing energy.

It is recognized that the effective field of view of the ptychographic inspection system 100 may be limited by the temporal and lateral coherence of the illumination beam 112 on the sample 114. Further, the field of view of the illumination beam 112 relates to image size (e.g., sizes of sample-plane images and/or diffraction-plane images) and also the throughput, where increasing the field of view increases the system throughput. Accordingly, the projection imaging sub-system 102 provides a coherent illumination beam 112 using any technique known in the art such as, but not limited to, providing a relatively small virtual source size, providing a relatively narrow bandwidth, or providing a highly parallel illumination beam 112 on the sample 114. Further, components of the projection imaging sub-system 102 such as, but not limited to, the illumination optics 118 and/or the objective lens 116 may relay the illumination beam 112 from the particle source 110 as a highly parallel beam. In one embodiment, the particle source 110 includes a cold field emitter operating substantially as a point source. In this regard, the illumination optics 118 and/or the objective lens 116 may collimate a diverging illumination beam 112 from the particle source 110 and direct the collimated beam to the sample 114. In another embodiment, the particle source 110 includes a laser-pumped photocathode to provide a highly parallel illumination beam 112. Accordingly, the illumination optics 118 and/or the objective lens 116 may relay the parallel illumination beam 112 to the sample 114.

The projection imaging sub-system 102 may generate a sample-plane image and a diffraction-plane image of any selected portion of the sample 114 using any technique known in the art. In one embodiment, the projection imaging sub-system 102 generates a sample-plane image of a selected portion of the sample 114 and a diffraction-plane image of the selected portion of the sample 114 sequentially using a single detector 124. For example, the projection optics 120 may include one or more lenses having adjustable positions. In this regard, the projection optics 120 may be selectively adjusted (e.g., upon receiving one or more control signals from the controller 104) such that the detector 124 is conjugate to a sample plane 130 for a sample-plane image or conjugate to a diffraction plane 132 (e.g., a back focal plane of the objective lens 116) for a diffraction-plane image. For instance, the projection optics 120 may include one or more translation stages to selectively position one or more lenses to provide for sample-plane imaging or diffraction-plane imaging. In another instance, the projection optics 120 may include one or more electronically controlled lenses (e.g., magnetic and/or electrostatic lenses) with controllable focusing powers to selectively provide for sample-plane imaging or diffraction-plane imaging.

Sequential areas of the sample 114 may be imaged (e.g., for sample-plane and/or diffraction-plane images) using any technique known in the art. For example, sequential areas of the sample 114 may be imaged by translating the sample 114 via a sample stage. In another instance, sequential areas of the sample 114 may be imaged by scanning the illumination beam 112 across the sample 114 (e.g., using magnetic or electrostatic deflectors). However, variations in the wavefront of the illumination beam 112 induced by scanning may negatively impact ptychographic imaging. Accordingly, scanning optics as well as a scanning range may be selected to limit such wavefront variations. Additionally, sequential areas of the sample 114 may be imaged using various techniques including, but not limited to, a step-and-settle technique, or a continuous swathing motion (e.g., to avoid settling times).

It is to be understood that the description of a projection imaging sub-system 102 as depicted in FIG. 1B and the associated descriptions above are provided solely for illustrative purposes and should not be interpreted as limiting. For example, the projection imaging sub-system 102 may include a multi-beam and/or a multi-column system suitable for interrogating multiple portions of the sample 114 simultaneously.

Figure 2:
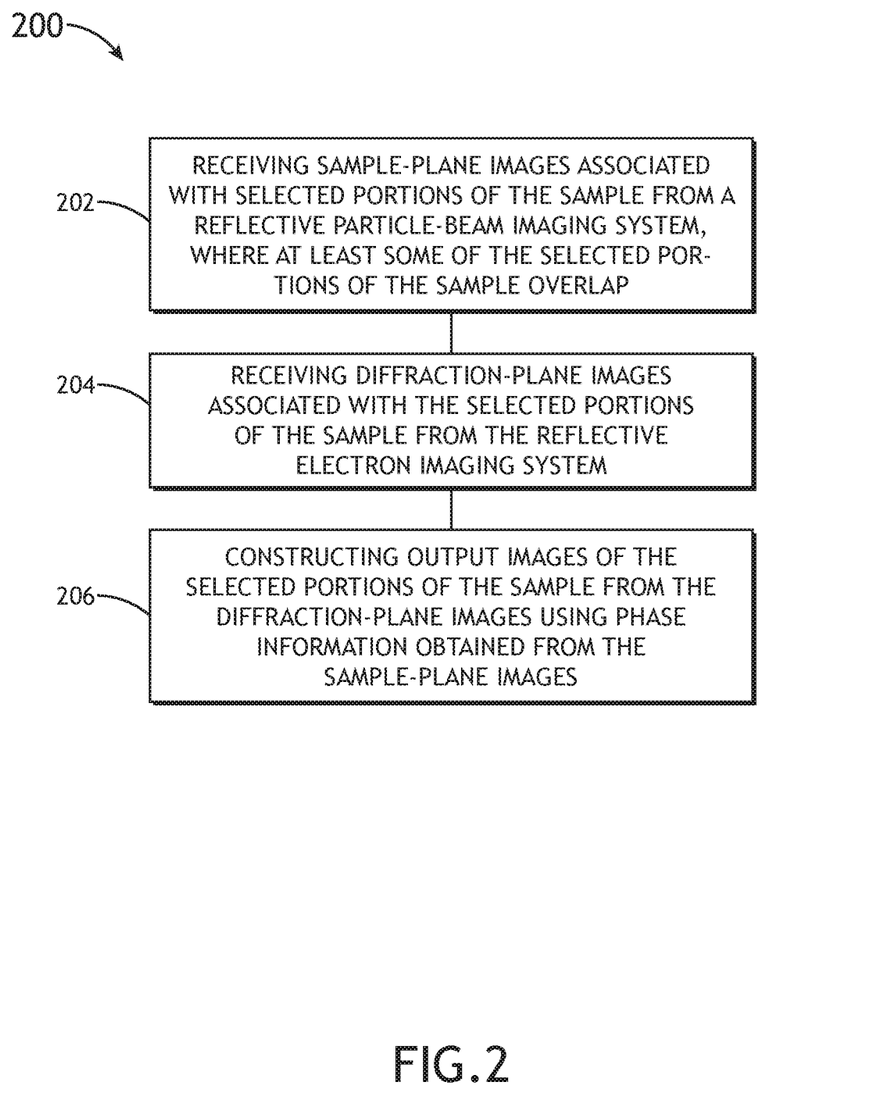
FIG. 2 is a flow diagram illustrating steps performed in an inspection method, in accordance with one or more embodiments of the present disclosure.

FIG. 2 is a flow diagram illustrating steps performed in an inspection method 200, in accordance with one or more embodiments of the present disclosure. Applicant notes that the embodiments and enabling technologies described previously herein in the context of the ptychographic inspection system 100 should be interpreted to extend to method 200. It is further noted, however, that the method 200 is not limited to the architecture of the ptychographic inspection system 100.

In one embodiment, the method 200 includes a step 202 of receiving two or more sample-plane images associated with two or more selected portions of the sample from a reflective particle-beam imaging system, where at least some of the two or more selected portions of the sample overlap. For example, the two or more sample-plane images correspond to images in which a detector (e.g., detector 124) is conjugate to the sample (e.g., the sample plane 130 corresponding to a surface of the sample 114). In this regard, the image generated on the detector corresponds to a spatial layout of elements on the sample.

In another embodiment, the method 200 includes a step 204 of receiving two or more diffraction-plane images associated with the two or more selected portions of the sample from the reflective electron imaging system. For example, the two or more diffraction-plane images may correspond to images in which the detector (e.g., detector 124) is conjugate to a diffraction plane (e.g., the diffraction plane 132). In this regard, the image generated on the detector corresponds to a diffraction pattern of illumination (e.g., the illumination beam 112) by the sample.

In another embodiment, the method 200 includes a step 206 of constructing one or more output images of the two or more selected portions of the sample from the two or more diffraction-plane images using phase information obtained from the two or more sample-plane images.

It is recognized herein that the diffraction pattern captured in a diffraction-plane image may correspond to a Fourier Transform of an object function associated with a sample. In this regard, a sample-plane image and a diffraction-plane image may be related by a Fourier Transform relationship.

In one embodiment, step 206 includes constructing one or more output images of the sample using a diffractive imaging technique. In this regard, aspects of both a sample-plane image and a diffraction-plane image associated with the same portion of the sample are combined to form an output image, which may provide a higher resolution than the sample-plane image in the presence of aberrations associated with the imaging system. Diffractive imaging is generally described in U.S. Patent Publication No. 2017/0031246, which is incorporated herein by reference in its entirety.

For example, a diffraction image may include amplitude information corresponding to a high spatial resolution, but may by itself lack requisite phase information to provide a high-resolution output image when an inverse Fourier Transform is applied. For instance, whereas high-frequency signals in a diffraction-plane image are associated scattered or diffracted portions of the illumination beam (e.g., the illumination beam 112) and may thus contribute to the construction of a sample-plane image, low-frequency signals in a diffraction-plane image may simply correspond to unscattered or reflected portions of the illumination. However, a directly-generated sample-plane image (e.g., an image directly generated by a system with a detector at a sample plane) may provide at least some relevant phase information that may be used to supplement the phase information in the diffraction-plane image. In one instance, amplitude information from a diffraction image and phase information from a sample image may be utilized in an iterative phase-retrieval algorithm to generate an output image having a higher resolution than the directly-generated sample image.

It is recognized herein that a dynamic range of the detector 124 may critically impact the performance of the ptychographic inspection system 100. In particular, it may be desirable to provide a high-dynamic range for diffraction-plane images. For instance, low-frequency signals in a diffraction-plane image (e.g., associated with unscattered or reflected portions of the illumination beam 112) may be substantially stronger (sometimes several orders of magnitude larger) than high-frequency signals (e.g., associated with scattered or diffracted portions of the illumination beam 112, secondary emission, backscattered emission, or the like). In one embodiment, the detector 124 provides at least 16-20 effective bit resolution above the noise floor. It is to be understood, however, that the detector 124 may provide any selected dynamic range and/or bit resolution suitable to provide a selected level of performance.

Figure 3:
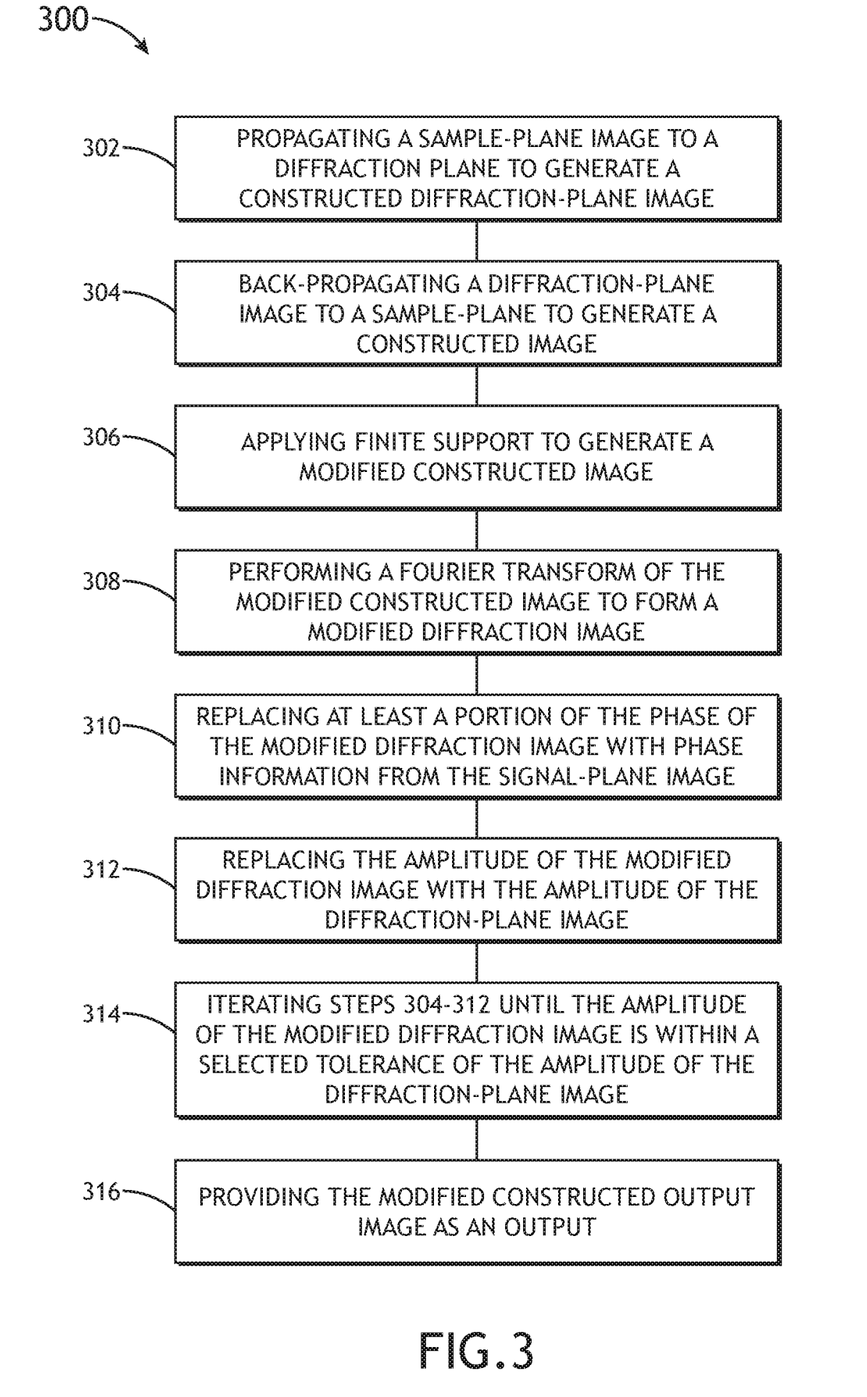
FIG. 3 is a flow diagram illustrating an iterative diffractive imaging algorithm for generating a high-resolution output image from a diffraction-plane image and a sample-plane image of a common portion of the sample, in accordance with one or more embodiments of the present disclosure.

FIG. 3 is a flow diagram illustrating an iterative diffractive imaging algorithm 300 for generating a high-resolution output image from a diffraction-plane image D(k) and a sample-plane image L(R) of a common portion of the sample (e.g., a common field of view), in accordance with one or more embodiments of the present disclosure. It is noted, however, that the iterative diffractive imaging algorithm of FIG. 3 requires or assumes finite support, where the field of view of the sample-plane image and the diffraction-plane image include only the object of interest. Put another way, finite support is satisfied when the object function is zero outside the field of view.

In one embodiment, the diffractive imaging algorithm 300 includes a step 302 of propagating a sample-plane image L(R) to a diffraction plane to generate a constructed diffraction-plane image. For example, step 302 may include performing a Fourier Transform operation such as, but not limited to, a Fast Fourier Transform (FFT) of a sample-plane image L(R) to generate a constructed diffraction-plane image:

$$\mathrm{FFT}\{L(R)\} = A \cdot \exp(-i\theta), \quad (1)$$

where A is the amplitude and θ is the phase associated with the Fourier Transform of the sample-plane image L(R).

In another embodiment, the diffractive imaging algorithm 300 includes a step 304 of back-propagating a diffraction-plane image D(k) to a sample plane to generate a constructed image G(R). For example, step 304 may include performing an Inverse Fourier Transform operation such as, but not limited to, an Inverse Fast Fourier Transform (IFFT), of a diffraction-plane image D(k)=D·exp(−iϕ) to form a constructed image G(R):

$$G(R) = \mathrm{Real}\{\mathrm{FFT}^{-1}\{D(k)\}\}. \quad (2)$$

In another embodiment, the diffractive imaging algorithm 300 includes a step 306 of applying finite support to generate a modified constructed image G*(R). For example, the step 306 may include setting G(R) to zero for values of R outside the field of view to generate a modified constructed image G*(R).

In another embodiment, the diffractive imaging algorithm 300 includes a step 308 of performing a Fourier Transform of the modified constructed image G*(R) to form a modified diffraction image G*(k):

$$G^*(k) = \mathrm{FFT}\{G^*(R)\} = D' \cdot \exp(-i\phi'), \quad (3)$$

where D' is the amplitude and ϕ is the phase of G*(k).

In another embodiment, the diffractive imaging algorithm 300 includes a step 310 of replacing at least a portion of the phase of the modified diffraction image G*(k) with phase information from the signal-plane image L(R) (e.g., from step 302). For example, step 310 may include replacing at least a portion of ϕ' with the at least a portion of θ. For example, low-frequency information from ϕ may be replaced with low-frequency information from θ. It is recognized herein that aberrations associated with an imaging system may typically have a greater impact on high-frequency portions of the phase θ than low-frequency portions. Accordingly, supplementing at least low-frequency portions of the constructed phase ϕ with corresponding portions of θ may facilitate generation of a high-resolution constructed image G(R).

In another embodiment, the diffractive imaging algorithm 300 includes a step 312 of replacing the amplitude of the modified diffraction image with the amplitude from the diffraction-plane image. For example, step 312 may include replacing D' of the modified diffraction image with the amplitude D from the diffraction-plane image D(k).

In another embodiment, the diffractive imaging algorithm 300 includes a step 314 of iterating steps 304-312 until the value of D' equals the value of D within a selected tolerance. In another embodiment, the diffractive imaging algorithm 300 includes a step 316 of providing the modified constructed image as an output. Accordingly, the iterative phase-retrieval steps may utilize both the amplitude D of the diffraction-plane image and at least part of the phase θ of the sample-plane image to generate an output image G(R) (e.g., from step 304 of the last iteration of the diffractive imaging algorithm 300 satisfying the termination condition) having higher resolution than the sample-plane image, despite the presence of aberrations in the imaging system.

However, it is recognized herein that the finite support requirement associated with the phase-retrieval algorithm of FIG. 3 may be impractical for many inspection applications where a sample of interest is extended in two or three-dimensions.

In another embodiment, ptychographic techniques are utilized to apply diffraction-imaging techniques such as, but not limited to, the algorithm illustrated in FIG. 3 to extended samples suitable for inspection applications. For example, in a ptychographic technique, both sample-plane and diffraction-plane images from two or more portions are captured for multiple sample locations (e.g., imaged areas) forming an extended portion of a sample (e.g., greater than a field of view of an imaging system), where images of adjacent portions of the sample (e.g., adjacent fields of view) overlap. In this regard, portions of each of the two or more images may be used in the imaging algorithm and the overlapping imaged areas may compensate for the lack of finite support in any given imaged area. Ptychographic imaging techniques are generally described in U.S. Pat. No. 10,162,161, M. J. Humphry, et al., "Ptychographic Electron Microscopy Using High-Angle Dark-Field Scattering for Sub-nanometer Resolution Imaging", Nature Communications 3, 730 (2012) and J. M. Rodenburg, "Ptychography and Related Diffractive Imaging Methods", Advances in Imaging and Electron Physics 150, 87-184 (2008), all of which are incorporated herein by reference in their entirety.

Figure 4:
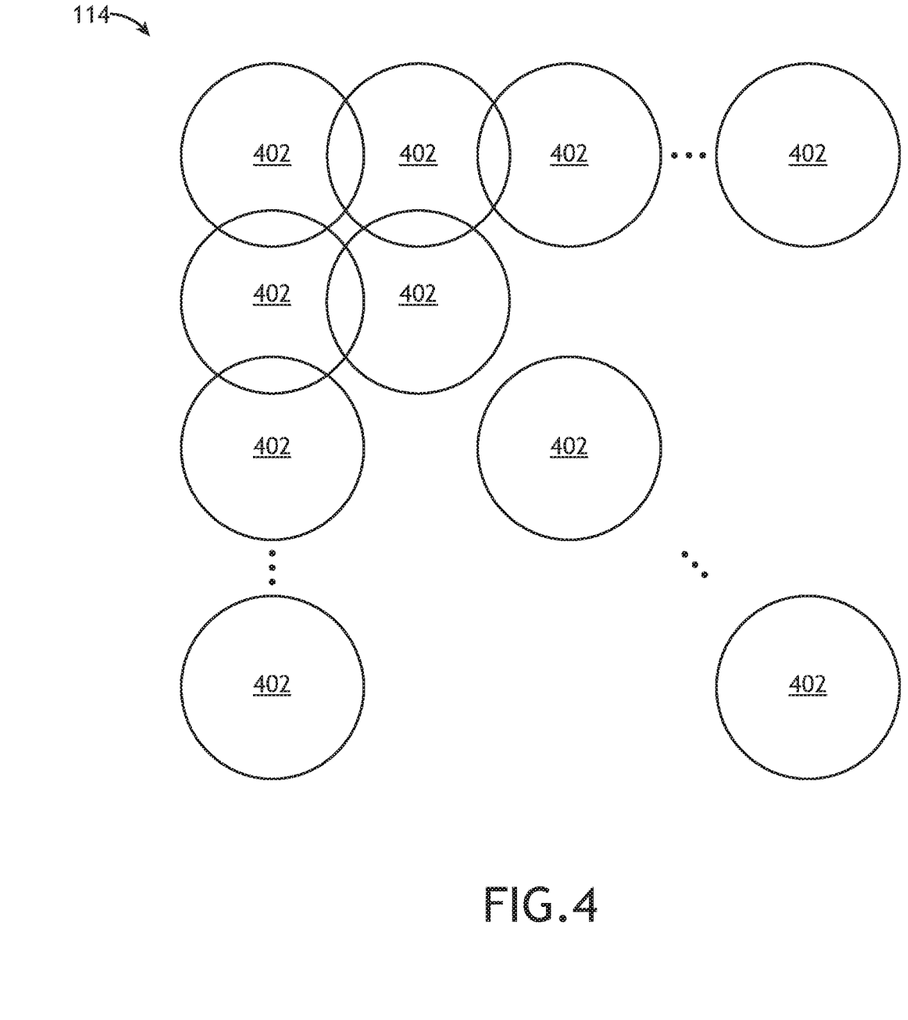
FIG. 4 is a schematic view of a series of imaged areas on a sample suitable for ptychographic imaging, in accordance with one or more embodiments of the present disclosure.

FIG. 4 is a schematic view of a series of imaged areas on a sample suitable for ptychographic imaging, in accordance with one or more embodiments of the present disclosure. In one embodiment, a sample-plane image and a diffraction-plane image are generated at each imaged area 402. Further, the imaged areas 402 may be arranged in any selected distribution where adjacent imaged areas 402 overlap to at least some extent. For example, as illustrated in FIG. 4, the imaged areas 402 may be distributed in an array pattern to cover an extended area of the sample. It is to be understood, however, that the array pattern illustrated in FIG. 4 is provided solely for illustrative purposes and should not be interpreted as limiting. Rather, the imaged areas 402 may be distributed in any selected distribution to form an extended area having any size or shape.

In addition, each imaged area 402 may have any suitable shape including, but not limited to circles (e.g., as illustrated in FIG. 4), squares, or rectangles. For example, the size and shape of each imaged area 402 may correspond to an effective field of view of an imaging system (e.g., the ptychographic inspection system 100). Accordingly, the size and shape of each imaged area 402 may be determined and/or limited by any component of the system including, but not limited to, a detector or an aperture.

Figure 5:
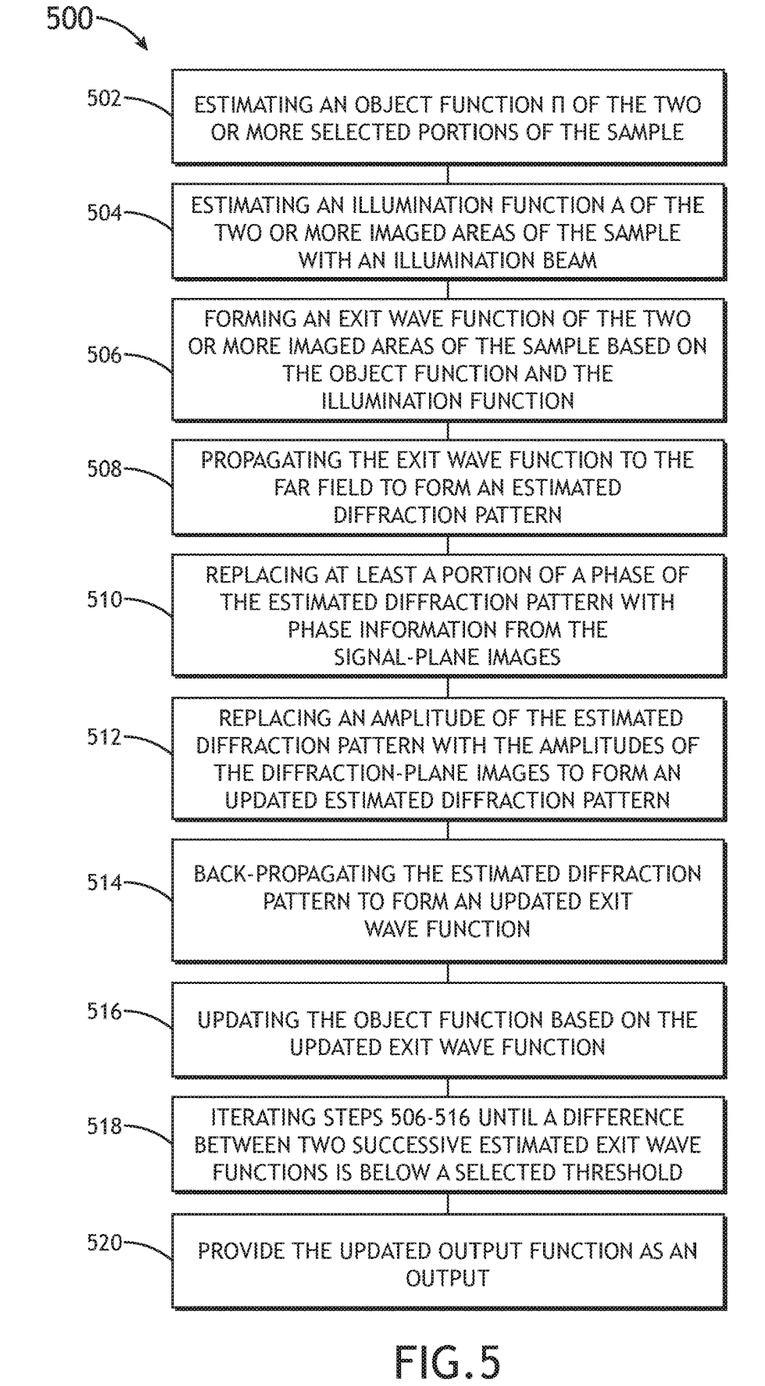
FIG. 5 is a flow diagram illustrating a ptychographic imaging technique suitable for imaging extended samples, in accordance with one or more embodiments of the present disclosure.

FIG. 5 is a flow diagram illustrating a ptychographic imaging technique 500 suitable for imaging extended samples, in accordance with one or more embodiments of the present disclosure. It is to be understood, however, that the ptychographic imaging technique 500 described herein is provided solely for illustrative purposes and should not be interpreted as limiting. Rather, systems and methods of the present disclosure may incorporate any ptychographic imaging technique known in the art such as, but not limited to, a ptychographical iterative engine (PIE), enhanced PIE (ePIE), or the like.

In one embodiment, the ptychographic imaging technique 500 includes a step 502 of estimating an object function $\Pi$ of the two or more selected portions of the sample (e.g., imaged areas 402). For example, two or more imaged areas 402 of the sample may be represented as $R_1 \ldots R_N$, where N is the number of imaged areas 402.

In another embodiment, the ptychographic imaging technique 500 includes a step 504 of estimating an illumination function A of the two or more imaged areas 402 of the sample with an illumination beam. For example, in the case of circular illumination, the illumination function may be represented as:

$$A = \Sigma a(r - Rj), \quad (4)$$

where j corresponds to an index and a corresponds to the illumination function at the location of the $j^{th}$ element of an array of illuminated locations (e.g., imaged areas 402), with each illumination element having a radius of R.

In another embodiment, the ptychographic imaging technique 500 includes a step 506 of forming an exit wave function of the two or more imaged areas 402 of the sample based on the object function and the illumination function. For example, an exit wave function may be formed as:

$$\phi_e = \Pi \cdot A, \quad (5)$$

noting that both $\Pi$ and A include the two or more imaged areas $R_1 \ldots R_N$.

In another embodiment, the ptychographic imaging technique 500 includes a step 508 of propagating the exit wave function to the far field to form an estimated diffraction pattern for the two or more imaged areas 402. For example, the exit wave function may be propagated to the far field using a Fourier Transform operation such as, but not limited to, a Fast Fourier Transform operation.

In another embodiment, the ptychographic imaging technique 500 includes a step 510 of replacing at least a portion of a phase of the estimated diffraction pattern with phase information from the signal-plane images associated with the two or more imaged areas 402. For example, low-frequency information from the estimated diffraction pattern may be replaced with low-frequency information from the signal-plane images for each of the imaged areas 402. As described previously herein, aberrations associated with an imaging system may typically have a greater impact on high-frequency portions of the phase than low-frequency portions. Accordingly, supplementing at least low-frequency portions of the estimated diffraction pattern with corresponding phase information from the sample-plane images may facilitate generation of a high-resolution output image G(R).

In another embodiment, the ptychographic imaging technique 500 includes a step 512 of replacing an amplitude of the estimated diffraction pattern with the amplitudes of the diffraction-plane images from the two or more imaged areas 402 of the sample to form an updated estimated diffraction pattern.

In another embodiment, the ptychographic imaging technique 500 includes a step 514 of back-propagating the estimated diffraction pattern to form an updated exit wave function $\phi_e^u$. For example, the updated exit wave function may be formed by back-propagating the estimated diffraction pattern using an inverse Fourier Transform operation such as, but not limited to, an inverse Fourier Transform operation.

In another embodiment, the ptychographic imaging technique 500 includes a step 516 of updating the object function based on the updated exit wave function. For example, updating the object function may be characterized as:

$$\Pi = U(\phi_e^u - \phi_e). \quad (6)$$

In another embodiment, the ptychographic imaging technique 500 includes a step 518 of iterating steps 506-516 until a difference between two successive estimated exit wave functions (e.g., $\phi_e^u - \phi_e$) is below a selected convergence threshold. In another embodiment, the ptychographic imaging technique 500 includes a step 520 of providing the updated object function as an output. In this regard, constructed sample-plane images based on the output object function may have a higher resolution than a directly-generated sample-plane image.

Further, it is recognized herein that the degree of overlap between adjacent images (e.g., sample-plane images and/or diffraction-plane images) may impact the sensitivity and/or the efficiency of the throughput of the ptychographic imaging technique 500. For example, increasing the overlap between adjacent imaged areas may decrease the number of iterations required for convergence. However, increasing the overlap between adjacent imaged areas may negatively impact the overall throughput by requiring capture of more images to characterize a selected area on the sample. Accordingly, the degree of overlap between sequentially-imaged areas (e.g., associated with sample-plane and/or diffraction-plane images) may be adjusted to provide a selected balance between throughput and sensitivity of the ptychographic imaging technique 500.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A particle-beam inspection system comprising:
   a reflective particle-beam imaging system providing an image of a selected portion of a sample and a diffraction pattern of the selected portion of the sample; and
   a controller communicatively coupled to the reflective particle-beam imaging system, the controller including one or more processors configured to execute program instructions causing the one or more processors to:
      receive two or more sample-plane images from the reflective particle-beam imaging system associated with two or more selected portions of the sample, wherein at least some of the two or more selected portions of the sample overlap;
      receive two or more diffraction-plane images from the reflective particle-beam imaging system associated with the two or more selected portions of the sample; and
      construct one or more output images of the two or more selected portions of the sample from the two or more diffraction-plane images using phase information obtained from the two or more sample-plane images.

2. The particle-beam inspection system of claim 1, wherein the one or more output images have higher resolution than the two or more images associated with the two or more selected portions of the sample.

3. The particle-beam inspection system of claim 1, wherein the one or more processors are configured to construct one or more output images of the two or more selected portions of the sample from the two or more diffraction-plane images using phase information obtained from the two or more sample-plane images by:
   constructing one or more output images of the two or more selected portions of the sample from the two or more diffraction-plane images using phase information obtained from the two or more sample-plane images based on a ptychographic imaging technique.

4. The particle-beam inspection system of claim 3, wherein the one or more processors are configured to execute the ptychography imaging technique by:
   estimating an object function of the two or more selected portions of the sample;
   estimating an illumination function of the two or more selected portions of the sample with an illumination beam;
   forming an exit wave function of the two or more selected portions of the sample based on the object function and the illumination function;
   propagating the exit wave function to the far field to form an estimated diffraction pattern;
   replacing a phase of the estimated diffraction pattern with phase information from the two or more images associated with the two or more selected portions of the sample;
   replacing a modulus of the estimated diffraction pattern with the two or more diffraction patterns associated with the two or more selected portions of the sample;
   back-propagating the estimated diffraction pattern to form an updated exit wave function;
   updating the object function based on the updated exit wave function; and
   providing an output image based on the updated object function.

5. The particle-beam inspection system of claim 4, further comprising:
   iterating the steps of:
      propagating the exit wave function to the far field to form an estimated diffraction pattern;
      replacing a phase of the estimated diffraction pattern with phase information from the two or more images associated with the two or more selected portions of the sample;
      replacing a modulus of the estimated diffraction pattern with the two or more diffraction patterns associated with the two or more selected portions of the sample;
      back-propagating the estimated diffraction pattern to form an updated exit wave function; and
      updating the object function based on the updated exit wave function until a difference between two successive estimated exit wave functions is below a selected convergence threshold, wherein the output image is based on the updated object function providing the difference between two successive estimated exit wave functions below the selected convergence threshold.

6. The particle-beam inspection system of claim 1, wherein the reflective particle-beam imaging system comprises:
   a reflective electron-beam imaging system.

7. The particle-beam inspection system of claim 6, wherein the two or more images associated with the two or more selected portions of the sample comprise:
   low-energy electron microscopy images.

8. The particle-beam inspection system of claim 6, wherein the reflective electron-beam imaging system comprises:
   an electron source configured to generate an electron beam;
   an objective lens;
   a magnetic prism to direct the electron beam to the objective lens, wherein the objective lens illuminates the selected portion of a sample with the electron beam, wherein the objective lens collects emitted electrons from the selected portion of the sample;
one or more electron detectors; and
one or more projection lenses, wherein the magnetic prism directs the emitted electrons collected by the objective lens to the one or more projection lenses, wherein the one or more projection lenses provide the two or more sample-plane images on at least one of the one or more electron detectors and the two or more diffraction-plane images on at least one of the one or more electron detectors.

9. The particle-beam inspection system of claim 8, wherein the one or more electron detectors comprise:
a single electron detector, wherein the one or more projection lenses sequentially provide:
one of the two or more sample-plane images of a selected sample location on the single electron detector; and
one of the two or more diffraction plane images of the selected portion of the sample to the single electron detector.

10. The particle-beam inspection system of claim 9, further comprising:
one or more translation stages to selectively position at least one of the one or more projection lenses.

11. The particle-beam inspection system of claim 9, wherein at least one of the one or more projection lenses has a selectable focal power.

12. The particle-beam inspection system of claim 7, wherein a landing energy of an electron beam on the sample in the reflective particle-beam imaging system is adjustable.

13. The particle-beam inspection system of claim 1, wherein the overlap between at least some of the two or more selected portions is adjustable.

14. The particle-beam inspection system of claim 1, wherein the reflective particle-beam imaging system comprises:
a reflective ion-beam imaging system.

15. A particle-beam inspection system comprising:
a controller communicatively coupled to a reflective particle-beam imaging system providing an image of a selected portion of a sample and a diffraction pattern of the selected portion of the sample, the controller including one or more processors configured to execute program instructions causing the one or more processors to:
receive two or more sample-plane images from the reflective particle-beam imaging system associated with two or more selected portions of the sample, wherein at least some of the two or more selected portions of the sample overlap;
receive two or more diffraction-plane images from the reflective particle-beam imaging system associated with the two or more selected portions of the sample; and
construct one or more output images of the two or more selected portions of the sample from the two or more diffraction-plane images using phase information obtained from the two or more sample-plane images.

16. The particle-beam inspection system of claim 15, wherein the one or more output images have higher resolution than the two or more images associated with the two or more selected portions of the sample.

17. The particle-beam inspection system of claim 15, wherein the one or more processors are configured to construct one or more output images of the two or more selected portions of the sample from the two or more diffraction-plane images using phase information obtained from the two or more sample-plane images by:
constructing one or more output images of the two or more selected portions of the sample from the two or more diffraction-plane images using phase information obtained from the two or more sample-plane images based on a ptychographic imaging technique.

18. The particle-beam inspection system of claim 17, wherein the one or more processors are configured to execute the ptychography imaging technique by:
estimating an object function of the two or more selected portions of the sample;
estimating an illumination function of the two or more selected portions of the sample with an illumination beam;
forming an exit wave function of the two or more selected portions of the sample based on the object function and the illumination function;
propagating the exit wave function to the far field to form an estimated diffraction pattern;
replacing a phase of the estimated diffraction pattern with phase information from the two or more images associated with the two or more selected portions of the sample;
replacing a modulus of the estimated diffraction pattern with the two or more diffraction patterns associated with the two or more selected portions of the sample;
back-propagating the estimated diffraction pattern to form an updated exit wave function;
updating the object function based on the updated exit wave function; and
providing an output image based on the updated object function.

19. The particle-beam inspection system of claim 18, wherein updating the object function based on the updated exit wave function comprises:
iterating the steps of:
propagating the exit wave function to the far field to form an estimated diffraction pattern;
replacing a phase of the estimated diffraction pattern with phase information from the two or more images associated with the two or more selected portions of the sample;
replacing a modulus of the estimated diffraction pattern with the two or more diffraction patterns associated with the two or more selected portions of the sample;
back-propagating the estimated diffraction pattern to form an updated exit wave function; and
updating the object function based on the updated exit wave function until a difference between two successive estimated exit wave functions is below a selected convergence threshold, wherein the output image is based on the updated object function providing the difference between two successive estimated exit wave functions below the selected convergence threshold.

20. The particle-beam inspection system of claim 15, wherein the reflective particle-beam imaging system comprises:
a reflective electron-beam imaging system.

21. The particle-beam inspection system of claim 20, wherein the two or more images associated with the two or more selected portions of the sample comprise:
low-energy electron microscopy images.

22. The particle-beam inspection system of claim 20, wherein the reflective electron-beam imaging system comprises:

an electron source configured to generate an electron beam;

an objective lens;

a magnetic prism to direct the electron beam to the objective lens, wherein the objective lens illuminates the selected portion of a sample with the electron beam, wherein the objective lens collects emitted electrons from the selected portion of the sample;

one or more electron detectors; and one or more projection lenses, wherein the magnetic prism directs the emitted electrons collected by the objective lens to the one or more projection lenses, wherein the one or more projection lenses provide the two or more sample-plane images on at least one of the one or more electron detectors and the two or more diffraction-plane images on at least one of the one or more electron detectors.

23. The particle-beam inspection system of claim 22, wherein the one or more electron detectors comprise:

a single electron detector, wherein the one or more projection lenses sequentially provide:

one of the two or more sample-plane images of a selected sample location on the single electron detector; and one of the two or more diffraction plane images of the selected portion of the sample to the single electron detector.

24. The particle-beam inspection system of claim 23, further comprising:

one or more translation stages to selectively position at least one of the one or more projection lenses.

25. The particle-beam inspection system of claim 23, wherein at least one of the one or more projection lenses has a selectable focal power.

26. The particle-beam inspection system of claim 21, wherein a landing energy of an electron beam on the sample in the reflective particle-beam imaging system is adjustable.

27. The particle-beam inspection system of claim 15, wherein the overlap between at least some of the two or more selected portions is adjustable.

28. The particle-beam inspection system of claim 15, wherein the reflective particle-beam imaging system comprises:

a reflective ion-beam imaging system.

29. An inspection method comprising:

receiving two or more sample-plane images from a reflective particle-beam imaging system associated with two or more selected portions of the sample, wherein at least some of the two or more selected portions of the sample overlap;

receiving two or more diffraction-plane images from the reflective particle-beam imaging system associated with the two or more selected portions of the sample; and constructing one or more output images of the two or more selected portions of the sample from the two or more diffraction-plane images using phase information obtained from the two or more sample-plane images.

30. The method of claim 29, wherein constructing one or more output images of the two or more selected portions of the sample from the two or more diffraction-plane images using phase information obtained from the two or more sample-plane images comprises:

constructing one or more output images of the two or more selected portions of the sample from two or more diffraction patterns using phase information obtained from the two or more images based on a ptychographic imaging technique.

31. The method of claim 30, wherein reconstructing one or more output images of the two or more selected portions of the sample from the two or more diffraction patterns using phase information obtained from the two or more images based on a ptychography imaging technique comprises:

estimating an object function of the two or more selected portions of the sample;

estimating an illumination function of the two or more selected portions of the sample with an illumination beam;

forming an exit wave function of the two or more selected portions of the sample based on the object function and the illumination function;

propagating the exit wave function to the far field to form an estimated diffraction pattern;

replacing a phase of the estimated diffraction pattern with phase information from the two or more images associated with the two or more selected portions of the sample;

replacing a modulus of the estimated diffraction pattern with the two or more diffraction patterns associated with the two or more selected portions of the sample;

back-propagating the estimated diffraction pattern to form an updated exit wave function;

updating the object function based on the updated exit wave function; and providing an output image based on the updated object function.

32. The method of claim 31, further comprising:

iterating the steps of:

propagating the exit wave function to the far field to form an estimated diffraction pattern;

replacing a phase of the estimated diffraction pattern with phase information from the two or more images associated with the two or more selected portions of the sample;

replacing a modulus of the estimated diffraction pattern with the two or more diffraction patterns associated with the two or more selected portions of the sample;

back-propagating the estimated diffraction pattern to form an updated exit wave function; and updating the object function based on the updated exit wave function until a difference between two successive estimated exit wave functions is below a selected convergence threshold, wherein the output image is based on the updated object function providing the difference between two successive estimated exit wave functions below the selected convergence threshold.

* * * * *